(12) United States Patent
Johnson

(10) Patent No.: US 9,558,803 B2
(45) Date of Patent: Jan. 31, 2017

(54) FIXED VOLTAGE SENSING IN A MEMORY DEVICE

(71) Applicant: Micron Technology, Inc., Boise, ID (US)

(72) Inventor: Adam D. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/451,071

(22) Filed: Aug. 4, 2014

(65) Prior Publication Data

US 2016/0035406 A1 Feb. 4, 2016

(51) Int. Cl.
*G11C 11/22* (2006.01)

(52) U.S. Cl.
CPC .................................. *G11C 11/2273* (2013.01)

(58) Field of Classification Search
CPC ...................................................... G11C 11/22
USPC .................................................. 365/145, 201
See application file for complete search history.

(56) References Cited

U.S. PATENT DOCUMENTS

2006/0023484 A1* 2/2006 Shiga ...................... G11C 11/22
 365/145
2009/0168576 A1* 7/2009 Fujita .................... G11C 11/404
 365/207

* cited by examiner

*Primary Examiner* — Anthan Tran
(74) *Attorney, Agent, or Firm* — Schwegman Lundberg & Woessner, P.A.

(57) ABSTRACT

Methods for sensing ferroelectric memory devices and apparatuses using the same have been disclosed. One such apparatus includes a ferroelectric memory cell coupled to a data line, a reference capacitance, and a common node coupled between the data line and the reference capacitance. A current mirror circuit is coupled to the data line and the reference capacitance. During a sense operation, the common node is configured to be at a fixed voltage and the current mirror circuit is configured to mirror displacement current from the reference capacitance to the ferroelectric memory cell.

20 Claims, 7 Drawing Sheets

FIXED VOLTAGE SENSING IN A MEMORY DEVICE

BACKGROUND

Memory devices are typically provided as internal, semiconductor, integrated circuits in apparatuses such as computers or other electronic devices. There are many different types of memory including non-volatile memory and volatile memory. Volatile memory can include memory such as static random-access memory (SRAM), dynamic random access memory (DRAM), synchronous dynamic random access memory (SDRAM). Non-volatile memory can include memory such as read only memory (ROM), phase change memory (PCM), flash memory, or ferroelectric random access memory (FeRAM).

FeRAM is a random-access memory that is similar in construction to DRAM (e.g., each cell having a capacitor and access transistor) but uses a ferroelectric layer instead of a dielectric layer in order to achieve non-volatility. An FeRAM cell can comprise a dielectric structure that includes a non-linear ferroelectric material (e.g., lead zirconate titanate (PZT)). The ferroelectric material typically has a higher dielectric constant than that of a DRAM's linear dielectric material due to the effects of semi-permanent electric dipoles formed in the crystal structure of the ferroelectric material.

One ferroelectric characteristic is that the ferroelectric material has the form of a hysteresis loop that is similar in shape to the hysteresis loop of ferromagnetic materials. When an external electric field is applied across a dielectric, the dipoles tend to align themselves with the field direction, produced by small shifts in the positions of atoms and shifts in the distributions of electronic charge in the crystal structure. After the charge is removed, the dipoles retain their polarization state. Binary "0"s and "1"s can be stored as one of two possible electric polarizations in each data storage cell.

A write operation to an FeRAM cell is similar to a DRAM write operation. A field is applied across the ferroelectric layer by charging the plates on either side of it, forcing the atoms inside into the "up" or "down" orientation (depending on the polarity of the charge), thereby storing a binary "1" or "0". A sense operation, however, is somewhat different than a DRAM in that the transistor forces the cell into a particular state (e.g., "0"). If the cell already held that particular state, nothing will happen in the output lines. If the cell held an inverse state (e.g., "1"), the re-orientation of the atoms in the film will cause a brief pulse of current in the output as they push electrons out of the metal on the "down" side. The presence of the residual charge on a coupled data line (e.g., bit line) can indicate that the cell held the inverse state. Since this process overwrites the cell, sensing FeRAM is a destructive process and the cell should be re-written if it was sensed.

FeRAM sensing schemes use a ramped plate voltage on the FeRAM plate in order to sense the residual charge left on the data line. As the plate voltage ramps upward, a polarized memory cell pushes its charge onto the data line, thus resulting in two different data line voltages depending on whether the memory cell was polarized. While memory manufacturers typically would like to reduce power consumption and increase memory performance, applying a ramped plate voltage can be a time and energy intensive process.

Thus, there are general needs to be able to sense FeRAM with a faster and lower energy process.

DETAILED DESCRIPTION

Figure 1:
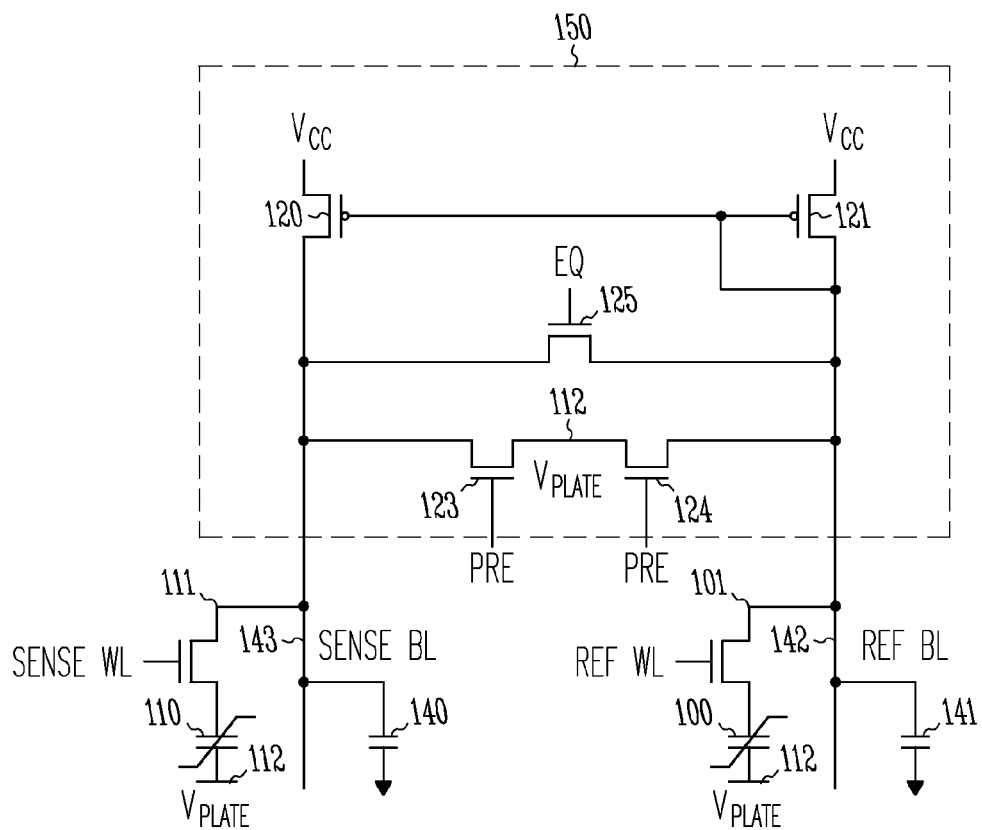
FIG. 1 illustrates a schematic diagram of an embodiment of a memory device illustrating fixed voltage sensing.
Figure 3:
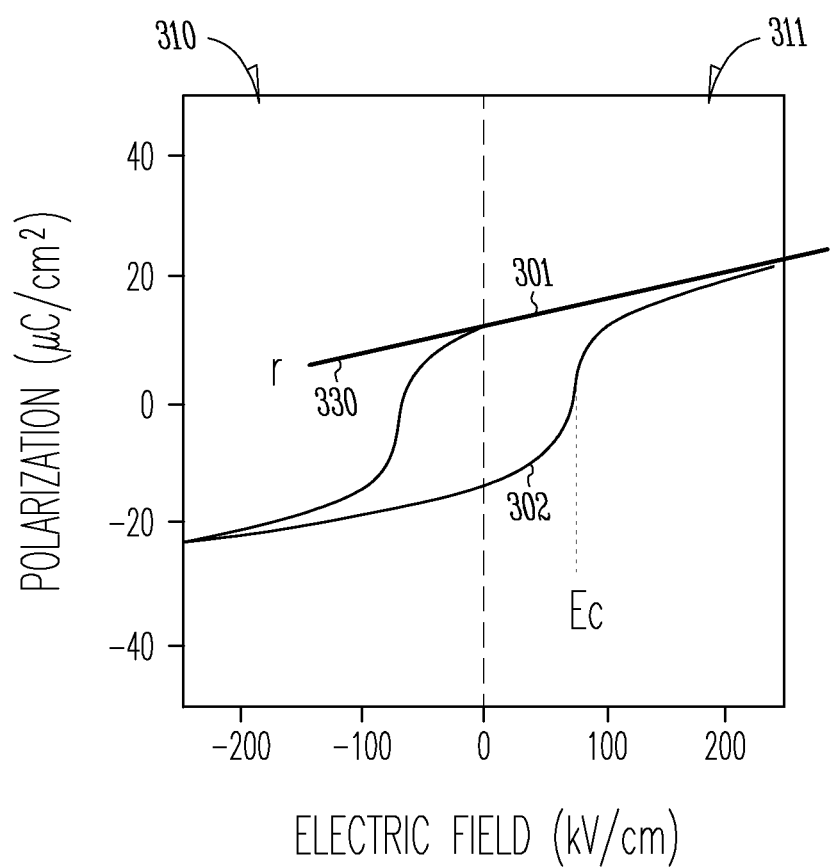
FIG. 3 illustrates a plot of electric field versus polarization charge in accordance with the embodiment of FIG. 1.

FIG. 1 illustrates a schematic diagram of an embodiment of a memory device circuit (e.g., FeRAM) illustrating fixed voltage sensing. The memory cell sensing concept illustrated in FIG. 1 uses a reference line 142 to mirror displacement current to a data line 143. The circuit of FIG. 1 illustrates a basic reference line concept. A more detailed implementation is shown in FIG. 3 and described subsequently.

The circuit of FIG. 1 includes a sense circuit 150 coupled to a memory cell 110 to be sensed using a reference memory cell 100. In an embodiment, the reference memory cell 100 can be replaced or used in combination with a reference capacitor (not shown) and/or the capacitance 141 of the reference line 142.

The sense circuit 150 includes two pull up transistors (e.g., PMOS) 120, 121 that are connected in a current mirror configuration. The transistors 120, 121 are coupled between a voltage supply node (e.g., $V_{CC}$, approximately 3V) and their respective data line 143 or reference line 142.

An equilibrate transistor 125 is coupled between the data line 143 and the reference line 142. The equilibrate transistor 125 is controlled by an EQ signal on its control gate such that an active EQ signal can activate the transistor 125 to couple the reference line 142, through the transistor, to the data line 143. Thus, the equilibrate transistor 125 allows the reference line 142 and reference memory cell 100 to mirror displacement current to the data line 143 and sense memory cell 110. If the memory cell 110 coupled to the data line 143 switches its polarization field, the resultant charge can cause the data line 143 to have a higher voltage than the reference line 142. If the memory cell 110 coupled to the data line 143 does not switch its polarization, the sense circuit 150 imbalance can cause the voltage on the data line 143 to be lower than the voltage on the reference line 142.

The sense circuit 150 can further include a pair of pre-charge transistors 123, 124 coupled in series between the reference line 142 and the data line 143. A $V_{plate}$ voltage is applied to a common (e.g., plate) node 112 between the two pre-charge transistors 123, 124. Each of the pre-charge transistors 123, 124 have control gates coupled to a pre-charge signal PRE that, when active, activates the pre-charge transistors 123, 124 such that the $V_{plate}$ voltage is applied to both the reference line 142 and the data line 143.

The memory device circuit further comprises the memory cell 110 to be sensed, which is coupled to the common node 112 through an access transistor 111. A control gate of the access transistor 111 is coupled to an access control signal WL that, when active, couples the memory cell 110 to be sensed to its respective data line 143. The data line 143 further shows a capacitance 140 that is a representation of the capacitance of the data line 143.

The memory device circuit further comprises the reference memory cell 100, which is coupled to the common node 112 through an access transistor 101. A control gate of the access transistor 101 is coupled to an access control signal Ref WL that, when active, couples the reference memory cell 100 to its respective reference line 142. The reference line 142 further shows a capacitance 141 that is a representation of the capacitance of the reference line 142.

For purposes of clarity, the embodiment of FIG. 1 shows only one data line 143 and one reference line 142 per sense circuit 150. Other embodiments can have a plurality of data lines and/or reference lines per sense circuit.

Figure 2:
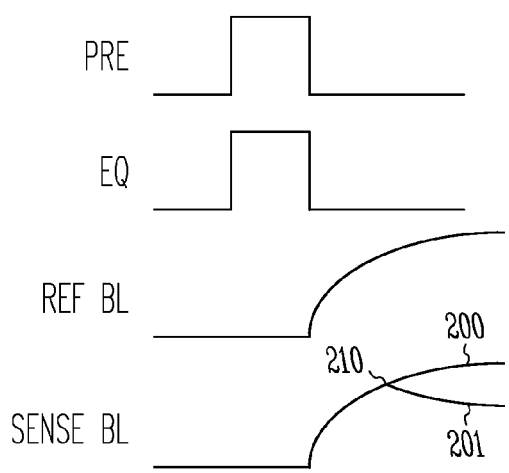
FIG. 2 illustrates a timing diagram of the fixed voltage sensing in accordance with the embodiment of FIG. 1.

FIG. 2 illustrates a timing diagram in accordance with an operation of the embodiment of FIG. 1. This figure shows the sense circuit 150 control signals PRE and EQ. As described previously, the PRE signals are used to pre-charge (e.g., apply a voltage to) respective lines 142, 143 to the voltage $V_{plate}$. The PRE signals are shown to be in an active high state. Another embodiment using a PMOS transistor in place of the NMOS transistors 123, 124 of FIG. 1 can use an active low signal. When PRE and EQ are active, the reference line (REF BL) and data line (SENSE BL) are at a fixed reference voltage (e.g., ground). When the PRE and EQ signals return to an inactive state, the diode-connected transistor 121 pulls the reference line 142 REF BL to a high state. Substantially simultaneously, the current mirror of the sense circuit 150 causes the current on the data line 143 SENSE BL to mirror the current on the reference line 142 REF BL. The data line 143 SENSE BL is going to charge at the same rate as the reference line 142 REF BL until the point 210 where the sensed memory cell 110 unloads it polarization current and pulls down on the data line 143 SENSE BL.

If the memory cell 110 being sensed is programmed with a first state (e.g., logical 1), the signal on the SENSE BL can decrease 201 as shown to result in the data line 143 eventually having a lower voltage than the reference line 142. This is due to the sensed memory cell 110 switching polarization.

If the memory cell 110 being sensed is programmed with a second state, the signal on the SENSE BL can continue to increase 200 as shown to result in the data line 143 eventually having a higher voltage than the reference line 142. This is due to the sensed memory cell 110 not switching polarization. Thus, the switching/non-switching of polarization of the memory cell 110 being sensed allows the sensing of the state of the memory cell 110. The sensing is accomplished while the common node is held at a fixed voltage (e.g., $V_{plate}$=0V). This concept is further illustrated in the plot of FIG. 3.

FIG. 3 illustrates a plot of electric field, in kilovolts per centimeter (kV/cm), versus polarization charge, in microcoulombs per square centimeter ($\mu C/cm^2$), in accordance with the embodiment of FIG. 1. In other words, FIG. 3 illustrates the memory cell charge versus voltage. The left half 310 of the plot, to the left of 0V, assumes a negative voltage across the sensed memory cell. The right half 311 of the plot, to the right of 0V, assumes a positive voltage across the sensed memory cell.

The plot of FIG. 3 illustrates two states of the memory cell as the upper curve 301 and the lower curve 302. Both curves start at 0V when a positive voltage is applied to across the memory cell being sensed. A straight line 330 is shown representing the charge versus voltage of the reference memory cell.

As the voltage across the sensed memory cell increases from 0V (moving to the right of the plot), the charge increases. On the upper plot 301 representing the first, non-switching state, the sensed memory cell charge increase is illustrated as a straight line that matches the reference cell line 330. On the lower plot 302 representing the second, switching state, the sensed memory cell charge increases from the lower part of that curve and, when the voltage reaches the $E_C$ point, the sensed memory cell unloads a large amount of the charge, resulting in a rapid increase in Q (assuming, from Q=CV, the vertical axis is Q, the horizontal axis if V, then the slope of the line 302 is the capacitance C). This switching of polarity and non-linear unloading of the charge from the sensed memory cell allows the second state to be determined in comparison to the linear increase of charge for the first state.

Figure 4:
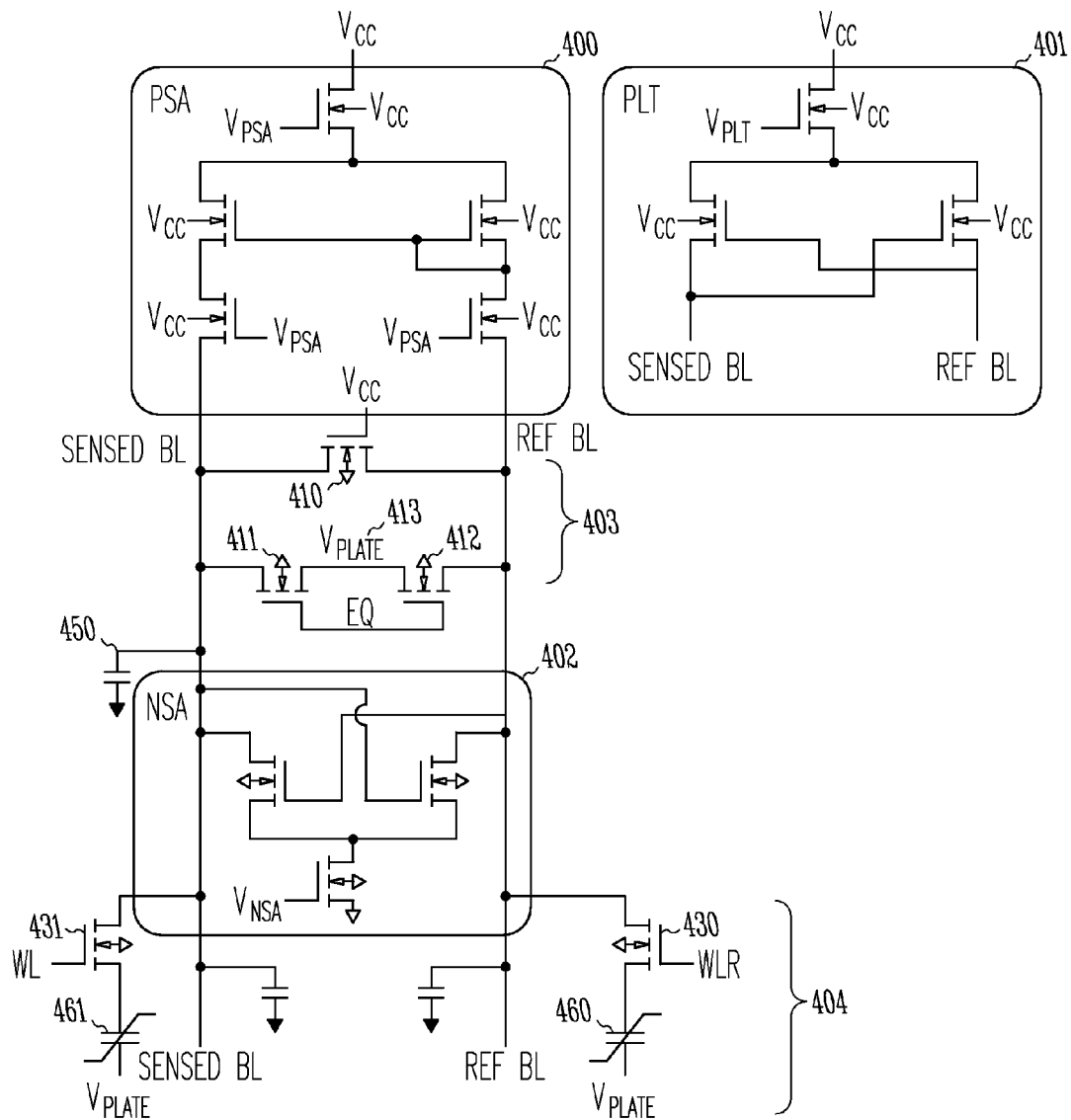
FIG. 4 illustrates a schematic of a memory device circuit diagram of an embodiment of an implementation of the fixed voltage sensing in accordance with the embodiment of FIG. 1.

FIG. 4 illustrates a schematic memory device circuit diagram of an embodiment of an implementation of the fixed voltage sensing concept in accordance with the embodiment of FIG. 1. This implementation is for purposes of illustration only as other embodiments can implement the fixed voltage sensing using other circuitry.

The memory device circuit comprises a P-sense amplifier 400 (e.g., pull-up sense amplifier) coupled to an N-sense amplifier 402 (e.g., pull-down sense amplifier) through a control circuit 403. The control circuit 403 can include the equilibrate transistor 410 and precharge transistors 411, 412 wherein the precharge transistors 411, 412 are coupled together through the $V_{plate}$ node 413.

A memory circuit 404 is coupled to the sense amplifiers 400, 402 and control circuit 403 through the data line SENSED BL and reference line REF BL. The memory circuit 404 can include the reference memory cell 460 that is coupled to the REF BL through the access transistor 430 (controlled by WLR). The sensed memory cell 461 is coupled to the SENSED BL through the access transistor 431. Both the reference memory cell 460 and the sensed memory cell 461 are coupled to the $V_{plate}$ node 413.

A latch circuit 401 is coupled to the memory circuit 404 through the SENSED BL and REF BL lines. The sensed data can be latched in the latch circuit 401 for later write back of the data, to the sensed memory cell, that was destroyed during the sense operation.

For purposes of clarity, only one data line is shown per sense amplifier. Other embodiments can associate multiple data lines with one sense amplifier. Similarly, other embodiments can associate multiple sensed memory cells with each reference memory cell.

Figure 5:
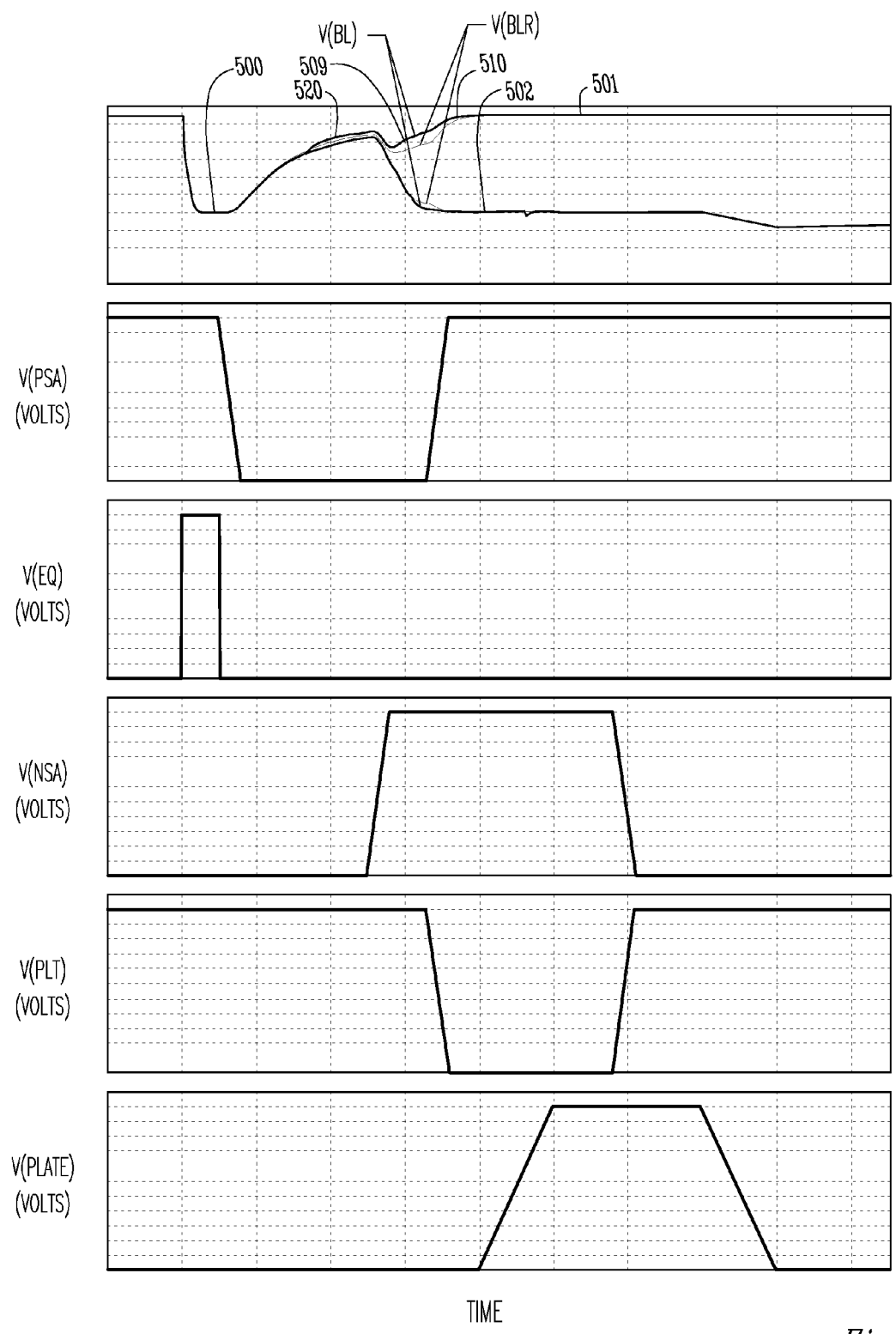
FIG. 5 illustrates a timing diagram of the fixed voltage sensing in accordance with the embodiments of FIG. 4.

FIG. 5 illustrates a timing diagram that is associated with the memory device circuit of FIG. 4. The various active states of the control signals presume the use of the types of transistors illustrated in FIG. 4. Other embodiments can use different types of transistor and, thus, have different active states. Similarly, the voltages shown in FIG. 5 with relation to the control signals and the memory device circuit responses are for purposes of illustration only. Other embodiments can use different voltages.

FIG. 5 illustrates the various control signals (e.g., voltages) that can be applied to the memory device circuit of FIG. 4. For example, FIG. 5 shows the $V_{PSA}$, $V_{WL}$, $V_{WLR}$, $V_{EQ}$, $V_{NSA}$, $V_{PLT}$, and $V_{PLATE}$ signals that can be applied to various nodes and transistor control gates. FIG. 5 also shows the correlation between these control signals and their associated responses (e.g., $V_{BL}$, $V_{BLR}$, $V_{VPR}$) from the memory device circuit of FIG. 4.

Referring to both FIGS. 4 and 5, the $V_{EQ}$ signal becomes active (e.g., high) which causes the data line voltage $V_{BL}$ and the reference line voltage $V_{BLR}$ to equilibrate to a reference voltage (e.g., ground) 500. The plot shows examples 501, 502 of both a logical "1" state and a logical "0" state being sensed. One state is going to be higher than the reference line and the other state is going to be lower than the reference line.

Next the $V_{PSA}$ signal is active (e.g., low). This signal turns on the current mirror of the P-sense amplifier 400. The current mirror causes both $V_{BL}$ and $V_{BLR}$ to begin to increase at location 520.

The N-sense amplifier 402 is then turned on by an active (e.g., high) $V_{NSA}$ signal. Depending on the state of the sensed memory cell, either the $V_{BL}$ or the $V_{BLR}$ data line voltage of the N-sense amplifier 402 will go low at this time 509. This time 509 is when the data is sensed by the N-sense amplifier 402. The $V_{PSA}$ signal goes back to an inactive state (e.g., high) so that the current mirror of the P-sense amplifier 400 is turned off. Also, the $V_{PLT}$ signal goes active (e.g., low) to turn on the latch 401 and store the sensed data 510. The $V_{VPLATE}$ signal also goes active (e.g., high) in order to restore the data from the latch to the sensed and reference memory cells that was destroyed by the sense operation. $V_{VPLATE}$ goes back inactive after this write operation.

Figure 6:
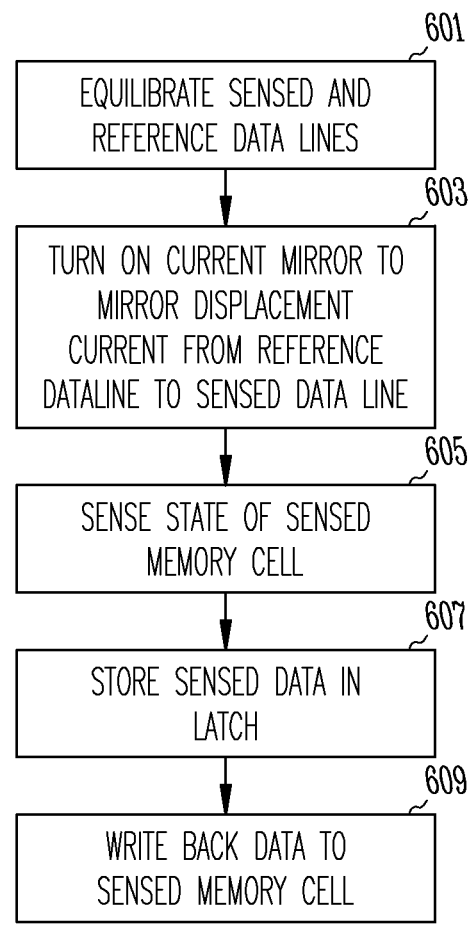
FIG. 6 illustrates a flowchart of an embodiment of a method for performing a fixed voltage sense operation in accordance with the embodiments of FIGS. 1 and 4.

FIG. 6 illustrates a flowchart of an embodiment of a method for performing a fixed voltage sense operation in accordance with the memory devices of FIGS. 1 and 4. The method equilibrates the data line and the reference capacitance 601. In an embodiment, the data line and a reference line are equilibrated to a reference voltage (e.g., ground).

The current mirror of a first sense amplifier is activated in order to mirror the displacement current from the reference capacitance to the data line 603. The reference capacitance can be a reference memory cell, a reference capacitance and/or a capacitance of a reference data line to provide the displacement current.

A second sense amplifier is activated in order to sense the state of the sensed memory cell 605. If the sensed memory cell has switched its polarization field, the resultant charge will cause a voltage on the data line to be higher than a voltage on the reference line. This can indicated the sensed memory cell is in a first state. If the polarization field has not switched, the voltage on the data line will be lower than the voltage on the reference line. In this case, the sensed memory cell is in a second state. The sensing is accomplished while the common node, coupled to both the reference capacitance and the sensed memory cell, is held at a fixed voltage (e.g., $V_{plate}=0V$).

Since a sense operation in an FeRAM is a destructive operation, the sensed data is stored in a latch 607 during the sensing. After the sensing, the latched data is written back to the sensed memory cell 609.

Figure 7:
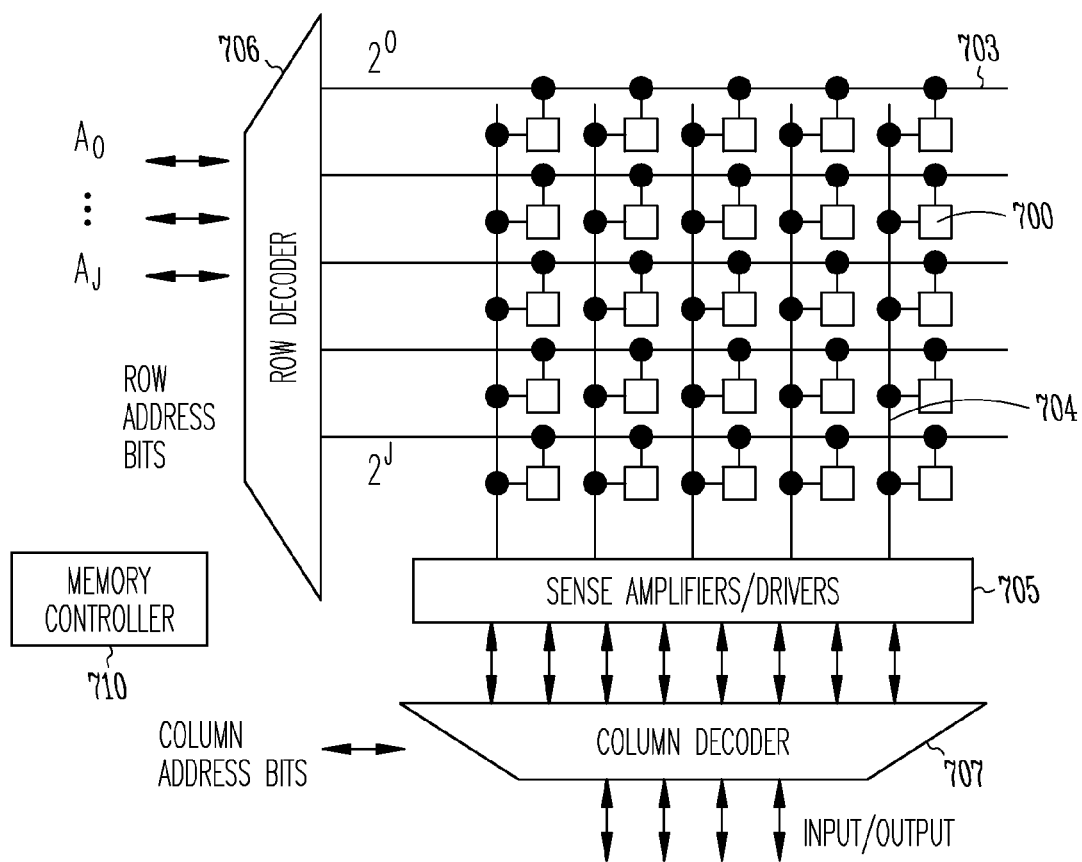
FIG. 7 illustrates a schematic diagram of an embodiment of a memory device in accordance with the embodiments of FIGS. 1 and 4.

FIG. 7 illustrates a memory array (e.g., FeRAM) that can incorporate the memory device and methods disclosed herein. The array comprises a plurality of memory cells 700, each memory cell 700 being coupled between an access line (e.g., word line) 703 and a data line (e.g., bit line) 704.

The data lines 704 are coupled to a sense circuit 705 that can sense the states of the memory cells 700. The sensing can occur through the sense circuit when the memory cells are coupled to the data lines through their respective activated control transistor.

A row decoder 706 is coupled to the word lines 703 to generate the word line signals in response to a row address from a controller. A column decoder 707 is coupled to the sense circuit 705 and generates a column address through drivers onto the data lines 704 in response to a column address from the controller. The column decoder 707 also outputs the sensed states from the memory cells 700 as well as accepts the data to be stored in the memory cells 700.

A memory controller 710 can control operation of the memory device. For example, the memory controller 710 can execute the method illustrated in FIG. 6 as well as generate or control generation of the various control signals (e.g., voltages) illustrated in FIG. 5. The memory controller 710 can be resident on the same integrated circuit as the memory array or on a separate integrated circuit.

Figure 8:
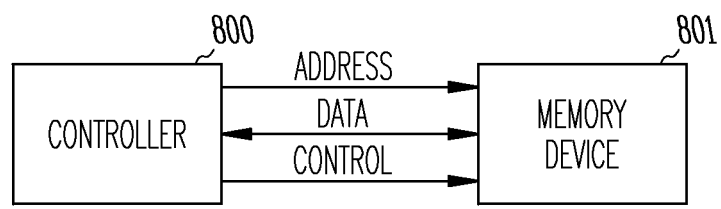
FIG. 8 illustrates a block diagram of an embodiment of system in accordance with various embodiments of the memory device of FIG. 7.

FIG. 8 illustrates a block diagram of a memory system that includes a memory device 801. A controller 800 may be used to control operations of the system. The controller 800 can be coupled to the memory device 801 over control, data, and address buses. In another embodiment, the address and data buses may share a common input/output (I/O) bus. The controller 800 can be part of the same integrated circuit as the memory device 801 or as separate integrated circuits.

As used herein, an apparatus may refer to, for example, circuitry, an integrated circuit die, a memory device, a memory array, or a system including such a circuit, die, device or array.

CONCLUSION

One or more embodiments use a reference capacitance to mirror displacement current to a data line. The reference capacitance can include a memory cell, a reference capacitor and/or a parasitic capacitance of a reference line. If a switch in polarization field of the sensed memory cell is sensed (e.g., the data line voltage greater than the reference line voltage), the sensed memory cell is storing a first state. If a switch in polarization field is not sensed (e.g., the data line voltage is less than the reference line voltage), the sensed memory cell is storing a second state. The sensing is accomplished while the common node between the sensed memory cell and the reference capacitance is held at a fixed voltage (e.g., ground).

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:
1. An apparatus comprising:
  a ferroelectric memory cell coupled to a data line;
  a reference capacitance coupled to a reference line;
  a common node coupled between the data line and the reference capacitance, wherein the common node is coupled to the data line through a first precharge transistor and to the reference line through a second precharge transistor, the first and second precharge transistors having control gates coupled to a precharge signal; and a current mirror circuit coupled to the data line and to the reference capacitance, the current mirror circuit separate from the first and second precharge transistors, and comprising first and second transistors having respective control gates connected to the reference line, wherein the common node is configured to be at a fixed voltage for sensing the memory cell and the current mirror circuit is configured to mirror displacement current from the reference capacitance to the ferroelectric memory cell.

2. The apparatus of claim 1, wherein the current mirror circuit is part of a sense circuit coupled to the data line and the reference capacitance.

3. The apparatus of claim 2, wherein the sense circuit further comprises an equilibration circuit coupled between the data line and the reference capacitance.

4. The apparatus of claim 1, further comprising:
a first sense amplifier coupled to the data line and the reference capacitance;
an equilibrate circuit coupled to the first sense amplifier and between the data line and the reference capacitance; and
a second sense amplifier coupled to the equilibrate circuit, the second sense amplifier comprising the current mirror circuit.

5. The apparatus of claim 4, further comprising a latch coupled to the data line and the reference capacitance.

6. The apparatus of claim 1, wherein the fixed voltage comprises a ground.

7. The apparatus of claim 1, wherein the reference capacitance comprises a memory cell.

8. The apparatus of claim 1, wherein the reference capacitance comprises a capacitance of a reference line.

9. The apparatus of claim 1, wherein the reference capacitance comprises a reference capacitor.

10. The apparatus of claim 1, wherein the control gates of the first and second transistors of the mirror circuit are directly connected to the reference line.

11. A method for sensing memory, the method comprising:
equilibrating a data line coupled to a ferroelectric memory cell to a reference line, wherein the data line and the reference line are coupled to a common node through a precharge circuit having one control signal;
mirroring a displacement current from the reference line to the data line while the common node is at a fixed voltage, the displacement current is mirrored through a mirror circuit comprising transistors, separate from the precharge circuit, having control gates connected to the reference line; and
sensing a state of the sensed ferroelectric memory cell.

12. The method of claim 11, wherein sensing the state of the ferroelectric memory cell comprises determining if a voltage of the data line voltage is greater than a voltage of the reference line.

13. The method of claim 12, wherein sensing the state of the ferroelectric memory cell comprises:
sensing a first state when the voltage of the data line is greater than the voltage of the reference line; and
sensing a second state when the voltage of the data line is less than the voltage of the reference line.

14. The method of claim 11, wherein sensing the state of the ferroelectric memory cell comprises sensing whether the ferroelectric memory cell switches polarization.

15. The method of claim 11, wherein equilibrating the data line to the reference line comprises equilibrating the data line and the reference line to the fixed voltage.

16. The method of claim 11, further comprising:
activating a first precharge transistor coupled between the common node and the data line; and
activating a second precharge transistor coupled between the common node and the reference line.

17. The method of claim 11, wherein the control gates of the transistors of the mirror circuit are directly connected to the reference line.

18. A system comprising:
a controller to control the system; and
a memory device, coupled to the controller, the memory device comprising:
an array of ferroelectric memory cells, a plurality of memory cells of the array of ferroelectric memory cells coupled to a data line;
a reference capacitance coupled to the data line through a common node and coupled to a reference line;
an equilibrate circuit coupled between the data line and the reference line and controlled by an equilibrate signal;
a precharge circuit coupled between the data line and the reference line, the precharge circuit comprising first and second precharge transistors controlled by a precharge signal; and
a current mirror circuit coupled to the data line and the reference line, the current mirror circuit comprising transistors, separate from the first and second precharge transistors, having control gates connected to the reference line, wherein, during a sense operation, the common node is configured to be at a fixed voltage and the current mirror circuit is configured to mirror displacement current from the reference capacitance to the ferroelectric memory cell.

19. The memory system of claim 18, further comprising access line transistors coupled between respective ones of the plurality of ferroelectric memory cells and the data line.

20. The system of claim 18, wherein the control gates of the transistors of the mirror circuit are directly connected to the reference line.

* * * * *